(12) United States Patent
Tseng et al.

(10) Patent No.: US 7,396,705 B2
(45) Date of Patent: Jul. 8, 2008

(54) METHOD FOR MANUFACTURING A THIN FILM TRANSISTOR

(75) Inventors: Chiang-Hung Tseng, Miao-Li (TW);
Jia-Pang Pang, Miao-Li (TW);
Chih-Cheng Lin, Miao-Li (TW); Tse Wu, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 169 days.

(21) Appl. No.: 11/301,019

(22) Filed: Dec. 12, 2005

(65) Prior Publication Data

US 2006/0128079 A1    Jun. 15, 2006

(30) Foreign Application Priority Data

Dec. 10, 2004    (TW) .............................. 93138294 A

(51) Int. Cl.
*H01L 21/82*    (2006.01)
(52) U.S. Cl. .......................... 438/128; 438/30; 438/149; 438/161; 257/E29.111
(58) Field of Classification Search .................. 438/30, 438/128, 149, 161
See application file for complete search history.

(56) References Cited

U.S. PATENT DOCUMENTS

| | | | | |
|---|---|---|---|---|
| 4,681,640 A | * | 7/1987 | Stanley | 438/488 |
| 5,407,710 A | * | 4/1995 | Baum et al. | 427/555 |
| 5,691,209 A | * | 11/1997 | Liberkowski | 438/10 |
| 5,936,291 A | | 8/1999 | Makita et al. | |
| 6,337,229 B1 | | 1/2002 | Yamazaki et al. | |

\* cited by examiner

*Primary Examiner*—Wai-Sing Louie
(74) *Attorney, Agent, or Firm*—Wei Te Chung

(57) ABSTRACT

A method for manufacturing a thin film transistor (TFT) includes the steps of: providing a substrate (1); and forming a TFT circuit on the substrate using laser-induced chemical vapor deposition (LCVD). Detailedly, the method includes providing the bare substrate, cleaning the substrate with cleaning liquid, and successively forming a gate electrode (2), a gate oxide layer (3), a source electrode (5), and a drain electrode (6) on the substrate by LCVD, thus obtaining the thin film transistor. The forming steps may be controlled by one or more computer programs. The LCVD can be pyrolytic LCVD, photolytic LCVD, or photophysical LCVD. The method is simple and inexpensive.

16 Claims, 4 Drawing Sheets

METHOD FOR MANUFACTURING A THIN FILM TRANSISTOR

BACKGROUND

1. Field of the Invention

The present invention relates to method for manufacturing thin film transistors (TFTs).

2. General Background

In recent years, efforts have been made to form high-performance semiconductor elements on an insulating substrate such as a glass substrate or on an insulating film. The successful manufacture of such components can realize the commercial production of items such as a large-scale liquid crystal display device with high resolution, a monolithic liquid crystal display device with a driver circuit formed on the same substrate for cost reduction, a fit-type image sensor with high speed and high resolution, and a three-dimensional integrated circuit (IC). As a semiconductor element, a thin film transistor using a silicon semiconductor thin film as an active region is generally used for these kinds of devices.

A typical method for manufacturing a TFT is summarized in FIG. 7. The method includes the steps of: providing a substrate; cleaning the substrate; forming a metal film on the substrate; coating the substrate with a photo-resist layer, and exposing and developing the photo-resist layer; etching the substrate; and finally removing the remainder of the photo-resist layer using one or more suitable solutions.

One or desired layers to be formed on a substrate may include an active layer, a gate electrode, and/or a source/drain electrode. When each layer is formed, a base material and a photo-resist layer need to be deposited on the substrate. Then, the photo-resist layer is exposed and developed to form a photo-resist pattern. Finally, the base material is etched using the photo-resist pattern as a mask. That is, deposition equipment, exposing equipment, developing equipment, and etching equipment are all necessary, and the process for manufacturing a TFT is complicated and costly.

Therefore, a new method for manufacturing a TFT that can overcome the above-described problems is desired.

SUMMARY

In one embodiment, a method for manufacturing a thin film transistor (TFT) includes the steps of: providing a substrate; and forming a TFT circuit on the substrate using laser-induced chemical vapor deposition (LCVD). Detailedly, the method includes providing the bare substrate, cleaning the substrate with cleaning liquid, and successively forming a gate electrode, a gate oxide layer, a source electrode, and a drain electrode on the substrate by LCVD, thus obtaining the thin film transistor. The forming steps may be controlled by one or more computer programs. The LCVD can be pyrolytic LCVD, photolytic LCVD, or photophysical LCVD. The method is simple and inexpensive.

Other objects, advantages, and novel features will become more apparent from the following detailed description when taken in conjunction with the accompanying drawings.

DETAILED DESCRIPTION OF PREFERRED EMBODIMENTS

Figure 1:
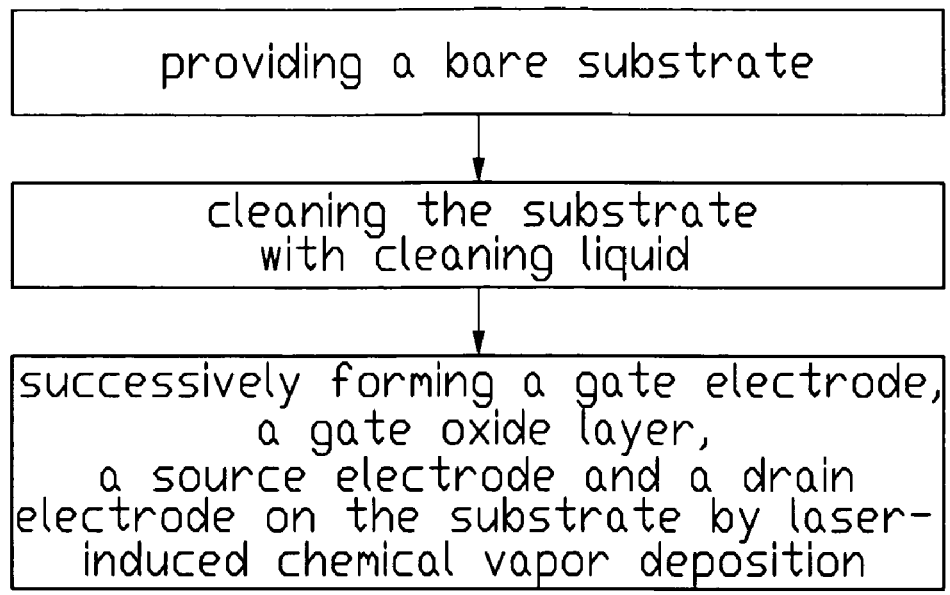
FIG. 1 is a flowchart of a method for manufacturing a thin film transistor according to a first embodiment of the present invention.

Referring to FIG. 1, this summarizes a method for manufacturing a thin film transistor (TFT) according to a first embodiment of the present invention. The method includes the following steps: providing a bare substrate, cleaning the substrate with cleaning liquid, and successively forming a gate electrode, a gate oxide layer, a source electrode, and a drain electrode on the substrate by laser-induced chemical vapor deposition (LCVD), thus obtaining the thin film transistor.

The LCVD process needs precursor molecules and may be performed under control of a computer. The decomposition of precursor molecules in LCVD can be activated thermally (pyrolytic LCVD), non-thermally (photolytic LCVD), or by a combination of both thermal and non-thermal decomposition (photophysical LCVD). The type of process activation to be used can be determined according to the morphology of the deposit and from measurements of the deposition rate as a function of laser power, wavelength, substrate material, and etc.

In a pyrolytic LCVD process, the laser light strikes the substrate surface, heating it locally to a few hundred degrees Celsius. Reactant gases impinge upon a heated region and undergo thermal decomposition, and one of the resultant chemical species condenses onto the substrate surface.

In a photolytic LCVD process, the absorbed laser energy dissociates reactant gas molecules non-thermally, and one of the resultant chemical species condenses onto the nearby surface of the substrate. In general, a photolytic process is insensitive to the composition of the substrate, as long as no specific surface reactions are involved. Normally a laser beam propagating parallel to the substrate surface is used to deposit a thin film onto the substrate surface.

Figure 2:
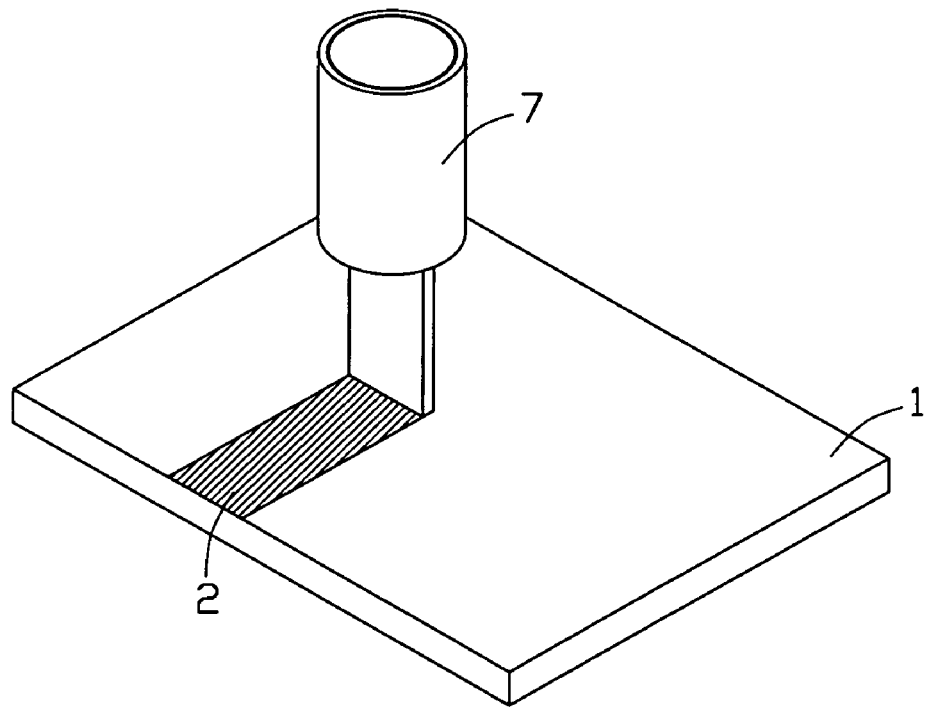
FIG. 2 is a schematic, isometric view of a step of depositing a gate electrode on a substrate according to the first embodiment.

Referring to FIGS. 2 to 6, the method for manufacturing a TFT according to the first embodiment is described in detail below:

As shown in FIG. 2, a bare substrate 1 is provided. The substrate 1 is generally in the form of a board. After cleaning the substrate 1, a metal film is deposited on the substrate 1 as a gate electrode 2 by using LCVD equipment 7.

Figure 3:
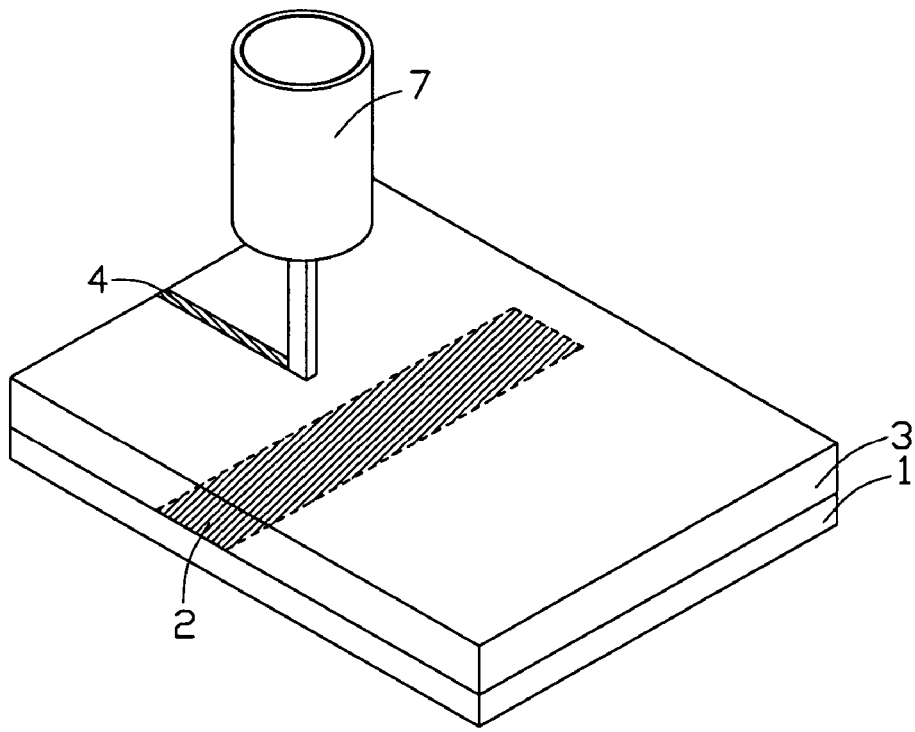
FIG. 3 is a schematic, isometric view of a step of forming a gate oxide layer on the substrate and depositing a data line on the gate oxide layer according to the first embodiment.

As shown in FIG. 3, a gate oxide layer 3 is formed on the substrate 1, the gate oxide layer 3 covering the gate electrode 2. A metal line is deposited on the gate oxide layer 3 as a data line 4. The data line 4 is perpendicular to the gate electrode 2.

Figure 4:
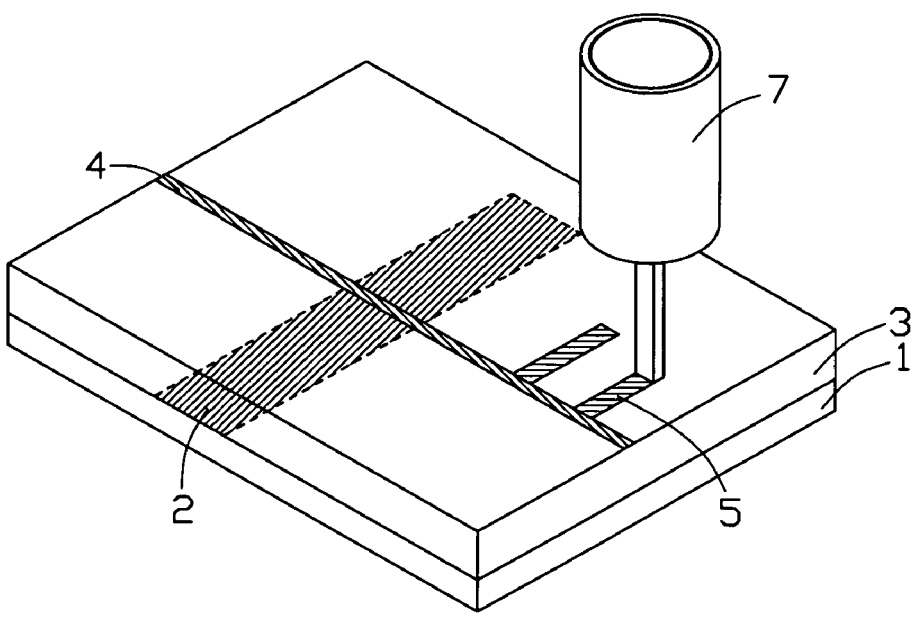
FIG. 4 is a schematic, isometric view of a step of depositing a source electrode on the gate oxide layer according to the first embodiment.

As shown in FIG. 4, a source electrode 5 including two parallel metal strips is deposited on the gate oxide layer 3. Each metal strip is connected to the data line 4 at one end.

Figure 5:
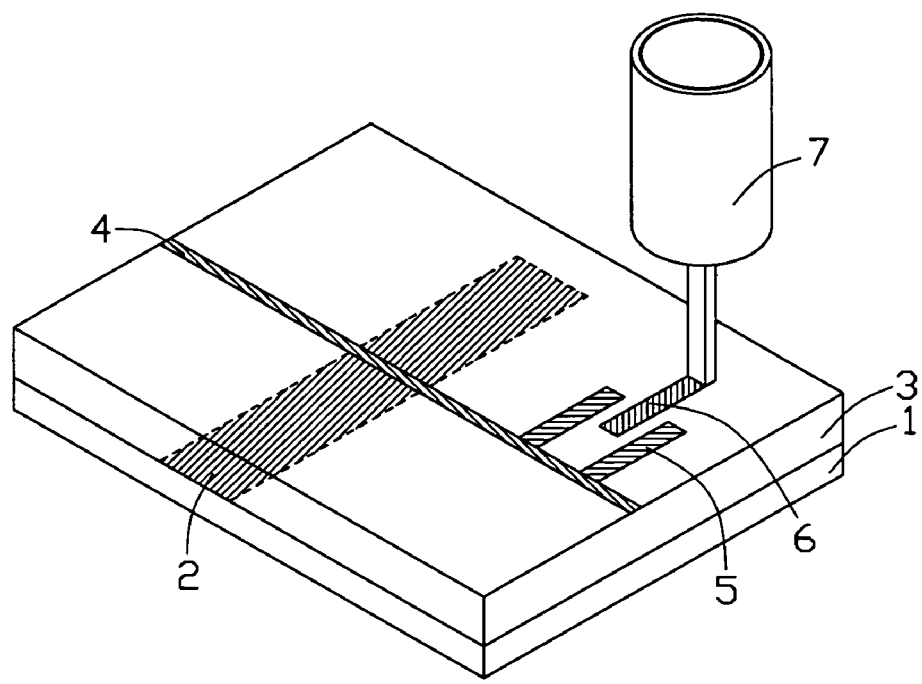
FIG. 5 is a schematic, isometric first view of a step of depositing a drain electrode on the gate oxide layer according to the first embodiment.
Figure 6:
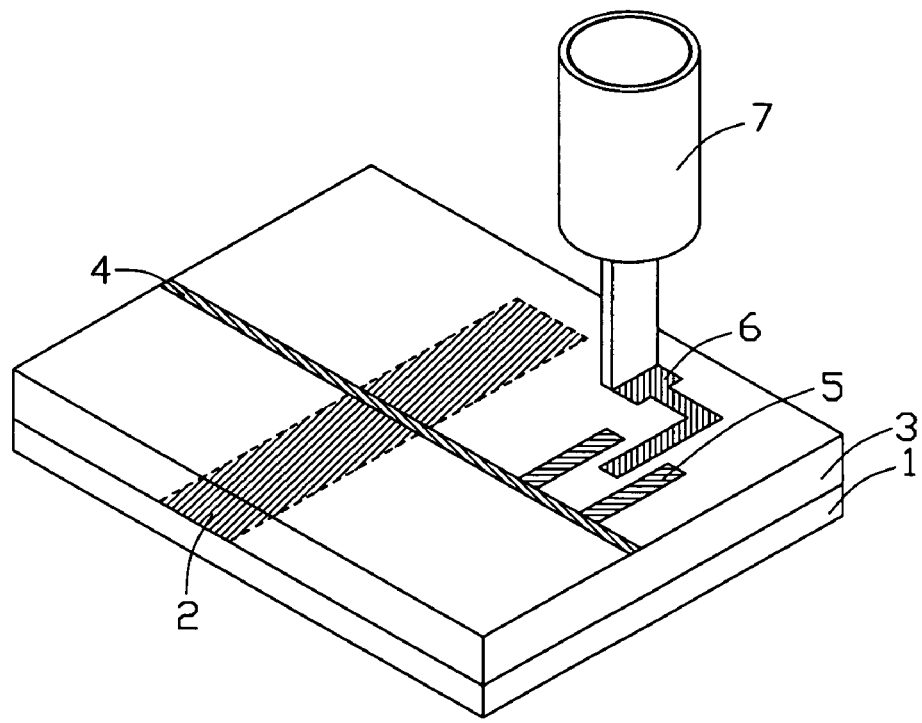
FIG. 6 is a schematic, isometric second view of the step of depositing the drain electrode on the gate oxide layer according to the first embodiment.
Figure 7:
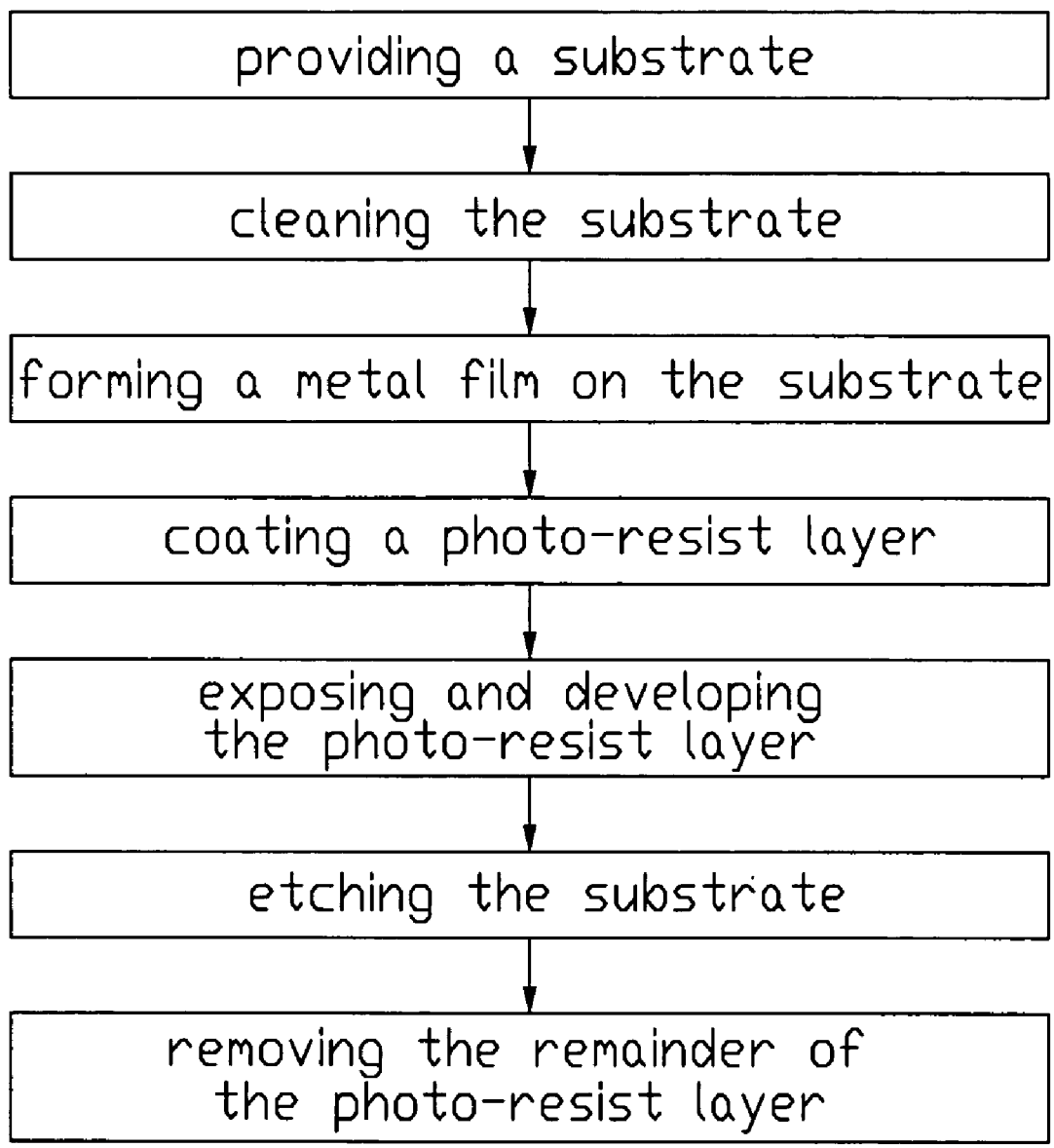
FIG. 7 is a flowchart of a conventional method for manufacturing a thin film transistor.

Referring to FIGS. 5 and 6, a drain electrode 6 is deposited on the gate oxide layer 3. The drain electrode 6 is located generally between the two metal strips of the source electrode 5, and extends away therefrom. Moreover, the drain electrode 6 is separate from the data line 4 and the source electrode 5. Thus, a TFT including the gate electrode 2, the source electrode 5, and the drain electrode 6 is completed.

A method for manufacturing a TFT according to a second embodiment of the present invention includes the following steps:

providing a bare substrate, and cleaning the substrate;

depositing a metal film on the substrate as a gate electrode by using LCVD equipment;

forming a gate oxide layer on the substrate, the gate oxide layer covering the gate electrode;

depositing a source electrode including two parallel metal strips on the gate oxide layer;

depositing a metal line on the gate oxide layer as a data line, wherein the data line is perpendicular to the gate electrode, and is connected to one end of each metal strip; and depositing a drain electrode on the gate oxide layer, wherein the drain electrode is located generally between the two metal strips of the source electrode and extends away therefrom, and the drain electrode is separate from the data line and the source electrode.

Widths, thicknesses, and arrangements of the metal line and the metal strips may be configured according to different design requirements. The depositing steps may be controlled by one or more computer programs. Thus, the process and/or the circuit arrangement of the TFT may be modified as needed.

The above-described methods include the LCVD process to deposit a TFT circuit. Unlike conventional methods, the method does not include exposing, developing, or etching steps. That is, the above-described methods merely need LCVD equipment, and do not need exposing equipment, developing equipment, or etching equipment. Therefore, the above-described methods are simple and inexpensive.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for manufacturing a thin film transistor (TFT), comprising:

(a) providing a substrate; and (b) forming a TFT circuit on the substrate using laser-induced chemical vapor deposition (LCVD), wherein step (b) comprises:

depositing a gate electrode on the substrate;

forming a gate oxide layer on the substrate, the gate oxide layer covering the gate electrode;

depositing a data line on the gate oxide layer, the data line being perpendicular to the gate electrode;

depositing a source electrode comprising two parallel metal strips, one end of each metal strip being connected to the data line; and depositing a drain electrode generally between the two metal strips of the gate electrode, the drain electrode being separate from the data line and the gate electrode.

2. A method for manufacturing a thin film transistor (TFT), comprising:

(a) providing a substrate; and (b) forming a TFT circuit on the substrate using laser-induced chemical vapor deposition (LCVD), wherein step (b) comprises:

depositing a gate electrode on the substrate;

forming a gate oxide layer on the substrate, the gate oxide layer covering the gate electrode;

depositing a source electrode comprising two parallel metal strips, one end of each metal strip being connected to the data line;

depositing a data line on the gate oxide layer, the data line being perpendicular to the gate electrode and being connected to one end of each metal strip of the source electrode; and depositing a drain electrode generally between the two metal strips of the gate electrode, the drain electrode being separate from the data line and the gate electrode.

3. The method as claimed in claim 1, wherein step (b) is performed under control of a computer program.

4. The method as claimed in claim 1, wherein the substrate is a bare board.

5. The method as claimed in claim 1, further comprising a step of cleaning the substrate, which step is performed between steps (a) and (b).

6. The method as claimed in claim 1, wherein pyrolytic LCVD is used in step (b).

7. The method as claimed in claim 1, wherein photolytic LCVD is used in step (b).

8. The method as claimed in claim 1, wherein photophysical LCVD is used in step (b).

9. A product made by the method as claimed in claim 1.

10. The method as claimed in claim 2, wherein step (b) is performed under control of a computer program.

11. The method as claimed in claim 2, wherein the substrate is a bare board.

12. The method as claimed in claim 2, further comprising a step of cleaning the substrate, which step is performed between steps (a) and (b).

13. The method as claimed in claim 2, wherein pyrolytic LCVD is used in step (b).

14. The method as claimed in claim 2, wherein photolytic LCVD is used in step (b).

15. The method as claimed in claim 2, wherein photophysical LCVD is used in step (b).

16. A product made by the method as claimed in claim 2.

* * * * *